United States Patent [19]
Pascucci

[11] Patent Number: 5,878,049
[45] Date of Patent: Mar. 2, 1999

[54] CIRCUITS AND METHODS FOR READ-ENABLING MEMORY DEVICES SYNCHRONOUSLY WITH THE REACHING OF THE MINIMUM FUNCTIONALITY CONDITIONS OF THE MEMORY CELLS AND READING CIRCUITS, PARTICULARLY FOR NON-VOLATILE MEMORIES

[75] Inventor: Luigi Pascucci, Sesto San Giovanni, Italy

[73] Assignee: SGS-Thomson Microelectronics S. r.l., Agrate Brianza, Italy

[21] Appl. No.: 840,056

[22] Filed: Apr. 24, 1997

[30] Foreign Application Priority Data

Apr. 29, 1996 [EP] European Pat. Off. .............. 96830238

[51] Int. Cl.⁶ ..................................................... G06F 11/00
[52] U.S. Cl. ............................................................ 371/21.1
[58] Field of Search ................................ 371/21.1, 21.2, 371/21.4, 21.6; 365/201; 395/750

[56] References Cited

U.S. PATENT DOCUMENTS 5,430,882   7/1995   Tilghman et al. ...................... 395/750

FOREIGN PATENT DOCUMENTS

A-0 233 550   2/1987   European Pat. Off. ......... H03K 5/13
A-0 471 542   2/1992   European Pat. Off. ........ G11C 29/00
A-0 500 958   9/1992   European Pat. Off. ........ G11C 11/34
A-2 226 721   7/1990   United Kingdom ............. H03K 5/15

Primary Examiner—Vincent P. Canney
Attorney, Agent, or Firm—Wolf, Greenfield & Sacks, P.C.

[57] ABSTRACT

A circuit for read-enabling a memory device with checking of the minimum functionality conditions of the memory cells and reading circuits, particularly for non-volatile memories, having a structure for reproducing the operating conditions within the memory matrix to determine the minimum duration of the step for pre-charging the bit lines involved in the reading operation, the structure being adapted to generate a pre-charge step interruption signal that depends on the reaching of the minimum functionality conditions; a mechanism for generating a power-on-reset signal for enabling reading when the minimum functionality conditions for reading correctness are reached, the power-on-reset signal generating mechanism being adapted to drive a control logic mechanism as well as a reading control and stimulation mechanism. The circuit further includes a memory mechanism for the pre-charge step, which is driven by the structure for reproducing the operating conditions within the memory matrix, by the control logic mechanism, and by the reading control and stimulation mechanism, the memory mechanism for the pre-charge step causing, at the onset of the minimum functionality conditions, the end of the pre-charge step to perform a first reading of the memory cells in assured conditions.

18 Claims, 7 Drawing Sheets

CIRCUITS AND METHODS FOR READ-ENABLING MEMORY DEVICES SYNCHRONOUSLY WITH THE REACHING OF THE MINIMUM FUNCTIONALITY CONDITIONS OF THE MEMORY CELLS AND READING CIRCUITS, PARTICULARLY FOR NON-VOLATILE MEMORIES

BACKGROUND OF THE INVENTION

1. Field of the Invention

The present invention relates to circuits and methods for read-enabling memory devices synchronously with the reaching of minimum functionality conditions of memory cells and reading circuits, particularly for non-volatile memories.

2. Discussion of the Related Art

In non-volatile memories with so-called static reading, it is possible to assuredly read a correct data item in the location addressed by the read address, even if initially the reading circuits have not reached their minimum functionality conditions.

Even if reading is started at a voltage level that is not yet sufficient to ensure assuredly correct reading of the data item, its correctness is in fact achieved nonetheless after a certain period of time, when the supply voltages assumes the steady state, i.e., when the supply voltage reaches at least the level of a threshold voltage of a generic non-volatile memory cell (approximately 2.1 V).

However, static-type reading approaches show difficulties in management for solving problems of noise generated by switching of outputs. Furthermore, these approaches do not easily allow to reduce consumptions.

In order to obviate this problem, solutions known as sampled and with dynamic (time-controlled) data sensing structures have been proposed.

The sampled-type reading approach entails reading the memory cell after a certain preset time and in this case it is indispensable that the read data item be actually correct, since dynamic reading does not allow modification of the data item at a later time.

Therefore, if reading is activated before the minimum functionality condition of a generic memory cell (voltage at least equal to the threshold voltage of a non-volatile cell) has been reached, the data item read in incorrect conditions remains incorrect until the next reading operation.

This drawback is particularly felt in memory devices that are meant to start up a more complex system, such as for example a computer, when the system enables the memory from the very start.

In this case, the first reading operation after device power-on and while the supply voltage level has not yet reached the steady state can have problems relating to the reliability of the read data. This occurs in all cases involving, for any reason, a transient situation of the power supply.

SUMMARY OF THE INVENTION

An object of the present invention is to provide a circuit for read-enabling a memory device that synchronizes the first reading operation with the reaching of the minimum functionality conditions of the memory cells and reading circuits, particularly for non-volatile memories, that allows performance of a first reading operation in assured conditions, for the safe acquisition of a correct data item, even in case of reading performed with dynamic data sensing structures.

Another object of the present invention is to provide a circuit for synchronizing the reading of a memory device with the reaching of minimum functionality conditions of the memory cells and reading circuits to dynamically link the beginning of the reading operation to the actual reaching of the minimum reading conditions.

Another object of the present invention is to provide a circuit for synchronizing the reading of a memory device with the reaching of minimum functionality conditions of the memory cells and of the reading circuits in which the reading event is dependent on the delay of the functionally most critical paths.

Another object of the present invention is to provide a circuit for synchronizing the reading of a memory device with the reaching of minimum functionality conditions of the memory cells and reading circuits to perform a first correct reading operation even if the operation is performed during a transient step of the supply voltage.

Another object of the present invention is to provide a circuit for synchronizing the reading of a memory device with the reaching of minimum functionality conditions of the memory cells and reading circuits to produce a first reading cycle at the end of a power-on-reset signal if the memory device is read-enabled from the very start.

Another object of the present invention is to provide a circuit for synchronizing the reading of a memory device with the reaching of minimum functionality conditions of the memory cells and reading circuits whose operation is correlated to the actual supply voltage values that are present (voltage $V_{DD}$ or boost voltage).

Another object of the present invention is to provide a circuit for synchronizing the reading of a memory device with the reaching of minimum functionality conditions of the memory cells and reading circuits that implements all the control functions of a reading process.

Another object of the present invention is to provide a circuit for synchronizing the reading of a memory device with the reaching of minimum functionality conditions of the memory cells and reading circuits that checks that the functionality of every internal component of the memory device has actually been reached.

Another object of the present invention is to provide a circuit for synchronizing the reading of a memory device with the reaching of minimum functionality conditions of the memory cells and reading circuits that blocks reading throughout the period between the enabling of a reading process and the reaching of the minimum functionality conditions.

Another object of the present invention is to provide a circuit that is highly reliable, relatively easy to manufacture, and at competitive costs.

An embodiment of the invention is directed to a circuit for read-enabling a memory device with checking of minimum functionality conditions of the memory cells and reading circuits, particularly for non-volatile memories. The circuit includes a structure for reproducing the operating conditions within the memory matrix to determine the minimum duration of the step for pre-charging the bit lines involved in the reading operation, the structure being adapted to generate a pre-charge step interruption signal that depends on the reaching of the minimum functionality conditions; means for generating a power-on-reset signal for enabling reading when the minimum functionality conditions for reading correctness are reached, the power-on-reset signal generating means being adapted to drive control logic means as well as reading control and stimulation means; and memory means for the pre-charge step, the means being driven by the structure for reproducing the operating conditions within the memory matrix, by the control logic means, and by the reading control and stimulation means; the memory means for the pre-charge step causing, at the onset of the minimum functionality conditions, the end of the pre-charge step to perform a first reading of the memory cells in assured conditions.

Another embodiment of the invention is directed to a method for performing a first reading in assured conditions for a memory device, particularly of the non-volatile type. The method includes the steps of generating a power-on-reset signal that is linked to a threshold and minimum detectable conductivity of a memory cell that is identical to a generic memory cell of the memory device, the signal indicating an onset of minimum functionality conditions of the memory cell and deactivating all reading activity throughout its duration;

generating, at the end of the power-on-reset signal, a read address transition signal to stimulate the reading of the memory device;

reproducing propagation delays of selection/deselection and pre-charge signals for a generic word line and for a generic bit line of the memory device, and generating a signal for determining the reaching of the working point of the bit line involved in the reading operation;

initializing the memory matrix line pre-charge activities; and generating, at the onset of the minimum functionality conditions, a pre-charge step end signal, for the subsequent first reading, in assured conditions, of the memory device.

BRIEF DESCRIPTION OF THE DRAWINGS

Further characteristics and advantages of the invention will become apparent from the description of a preferred but not exclusive of the device according to the invention, illustrated only by way of non-limitative example in the accompanying drawings, wherein.

DETAILED DESCRIPTION

Figure 1:
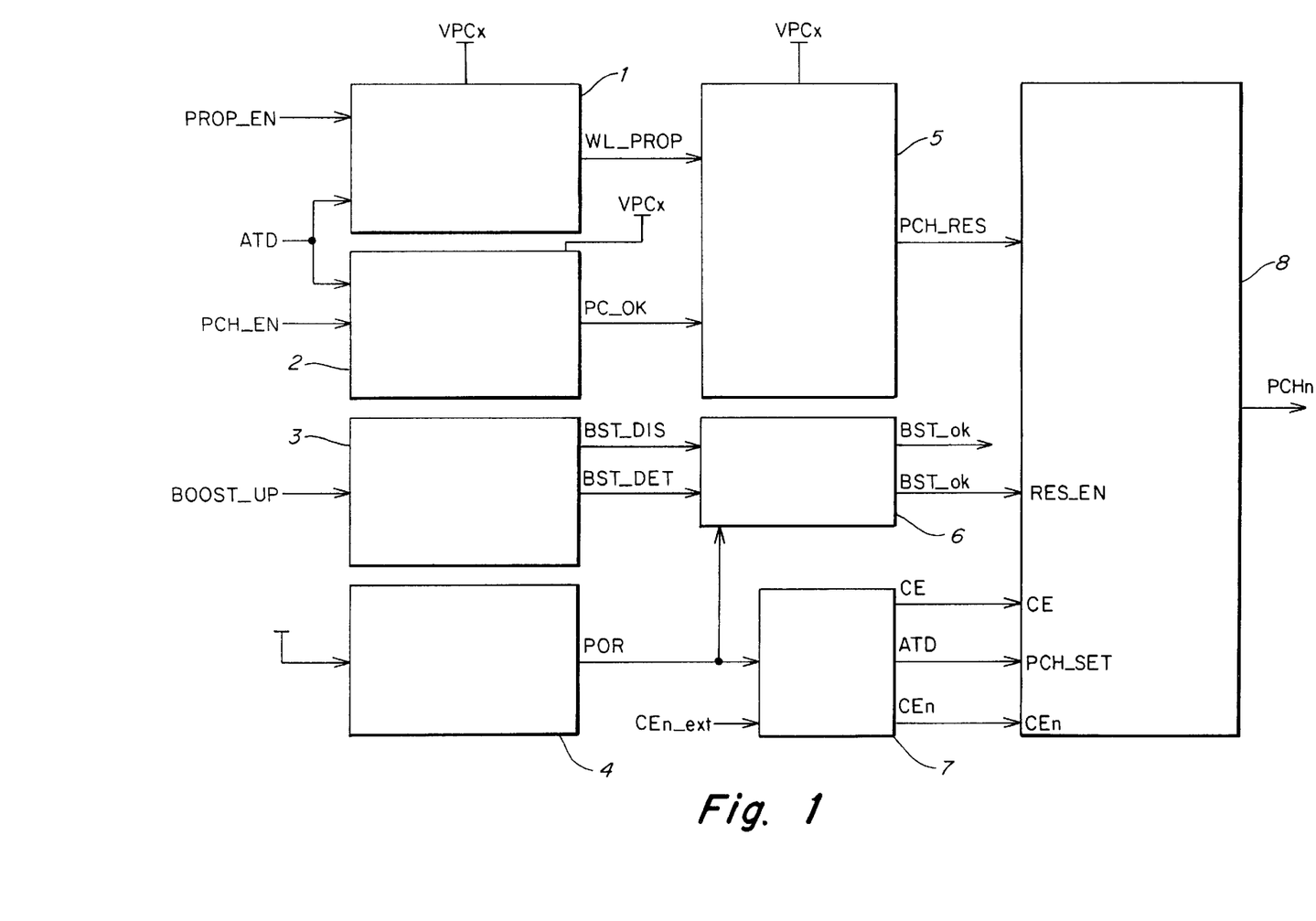
FIG. 1 is a block diagram of a circuit according to the invention.

The invention will now be described with reference to the above figures. FIG. 1 illustrates a the circuit according to the invention that includes means 1 for reproducing the propagation along a generic word line of a non-volatile memory device, which is adapted to reproduce a propagation delay of a signal along a word line; means 2 for reproducing the selection/deselection and pre-charge conditions of a generic bit line, which is adapted to reproduce the same selection/deselection and pre-charge delays of a bit line; means 3 for detecting when a boost voltage reaches a preset threshold; means 4 for generating a so-called power-on-reset (POR) signal as a function of the threshold voltage of a non-volatile memory cell and of a minimum detectable conductivity condition of a memory cell; means 5 for determining whether a working point of a generic bit line has been reached, in order to produce a signal for interrupting a pre-charge step.

The means 1, 2, and 5 form a structure for reproducing the operating conditions within the memory matrix to determine the duration of the pre-charge step; this duration is thus linked to the real conditions of the memory device and of the power supply.

The means 1 for reproducing the propagation delay of a generic word line is described in detail in European patent application no. 96830160.6, which is hereby incorporated by reference.

The means 2 for reproducing the selection/deselection and pre-charge conditions of a generic bit line and the means 5 for determining the reaching of the working point for the consequent generation of a pre-charge interruption signal are described in detail in European patent application no. 968301978.8, which is hereby incorporated by reference.

The means 3 for detecting when a boost voltage has reached a preset threshold is described in European patent application no. 95830360.4, which is hereby incorporated by reference.

The means 4 for generating the POR signal is described in European patent application no. 96830046.7, which is hereby incorporated by reference.

The means 1 for reproducing propagation along a generic word line is supplied a voltage VPCx, which can vary between a supply voltage $V_{DD}$ and a boost voltage.

Similarly, the means 2 for reproducing the selection/deselection and pre-charge conditions of a generic bit line and the means 5 for determining the reaching of the working point of a bit line are also supplied the voltage VPCx.

The means 1 for reproducing propagation along a generic word line receives on an input a control signal PROP_EN and an address transition detection signal ATD for synchronizing its operation with a read address transition of the memory, and emits on an output a signal WL_PROP that is sent on an input to the means 5 for determining the reaching of the working point to determine the end of the pre-charge interval.

The means 2 for reproducing the selection/deselection and pre-charge conditions of a generic bit line in turn receives on an input a control signal PCH_EN in addition to the above-mentioned signal ATD, and emits on an output the signal PC_OK, which is sent to the means 5 for determining the reaching of the working point, which in turn emits on an output a pre-charge step interruption signal PCH_RES.

The means 3 for determining whether a boost voltage has reached a preset level receives on an input a control signal BOOST_UP, and emits on outputs a signal BST_DIS and a signal BST_DET, which are sent to control logic means 6 adapted to ensure the reaching of the minimum functionality conditions.

The control logic means 6 emits on an output the signal BST-ok.

The means 4 for generating a POR signal emits on an output the POR signal, which is sent in input to the control logic means 6 and to means 7 for controlling and stimulating the reading of the memory device.

The means 7 receives on an input a signal CEn_ext for controlling the enabling of the device, in addition to the signal POR, and emits on outputs a signal CE for enabling the device, a signal ATD, and the inverted device enabling signal CEn.

The output signals of the means 5 for determining the reaching of the working point, of the control logic means 6, and of the reading control and stimulation means 7 are sent on inputs to memory means 8 for the pre-charge step, which is set at the onset of the minimum functionality conditions to remain in the pre-charge step until the propagations of the signals on the lines (word lines and bit lines) have occurred completely.

The memory means 8 for the pre-charge step emits the inverted pre-charge signal PCHn.

The signals on inputs to the memory means 8 for the pre-charge step are the signals PCH_RES, CE, CEn, PCH_SET (for setting the pre-charge), and RES_EN (for control).

The block diagram of FIG. 1 is shown in detail in the following FIGS. 2 to 10; each figure shows in detail a single block of FIG. 1.

Figure 2:
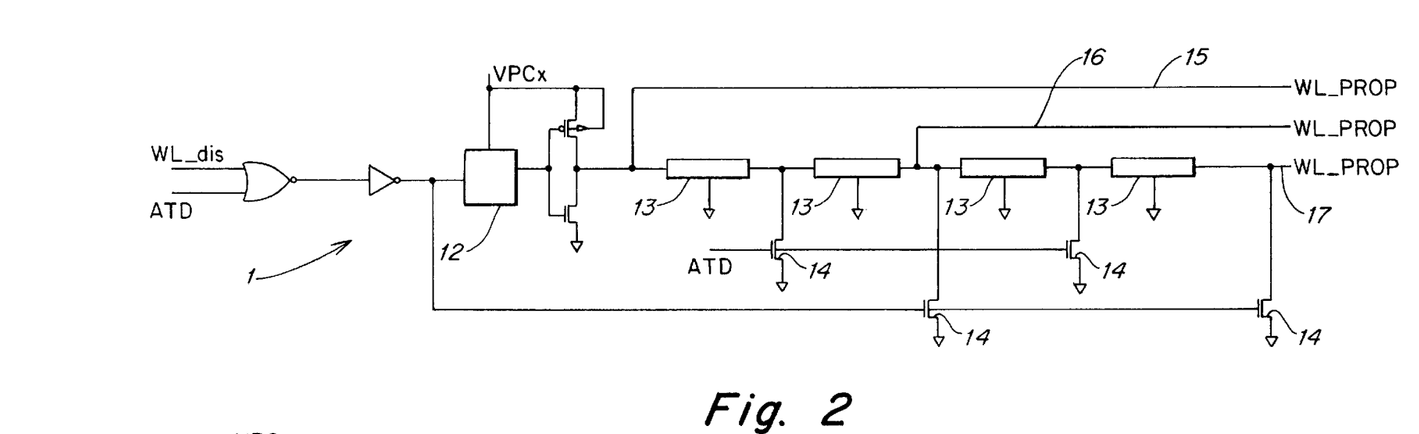
FIG. 2 is a detailed circuit diagram of a portion of the circuit shown in the block diagram of FIG. 1.

FIG. 2 is a detail view of the means 1 for reproducing propagation along a generic word line (which is the subject of a previous patent application, as mentioned); the means 1 structurally and dimensionally reproduces a generic word line to provide in output a propagation end sensing signal.

The means 1 is driven by a control signal WL_dis and by the signal ATD. In order to take into account the various possible operating voltages in the memory device ($V_{DD}$ or boost voltage), the means 1 has an elevator structure 12 that is supplied the voltage VPCx and a plurality of RC structures 13 that are adapted to reproduce the intrinsic delays of a generic word line managed with hierarchical decoders.

Transistors 14 are provided to quickly reset to zero the propagation conditions along the line.

The output signal WL_PROP can be taken in three different points of the reproduced word line: at the beginning 15, in an intermediate point 16, and at the end of the line 17. This adapts the circuit for reproducing propagation along a generic word line to different speed requirements of a memory device.

The output signal taken at the initial point of the line in fact corresponds to the fastest possible reading mode, whereas the signal taken at the end of the line corresponds to the slowest mode.

Figure 3:
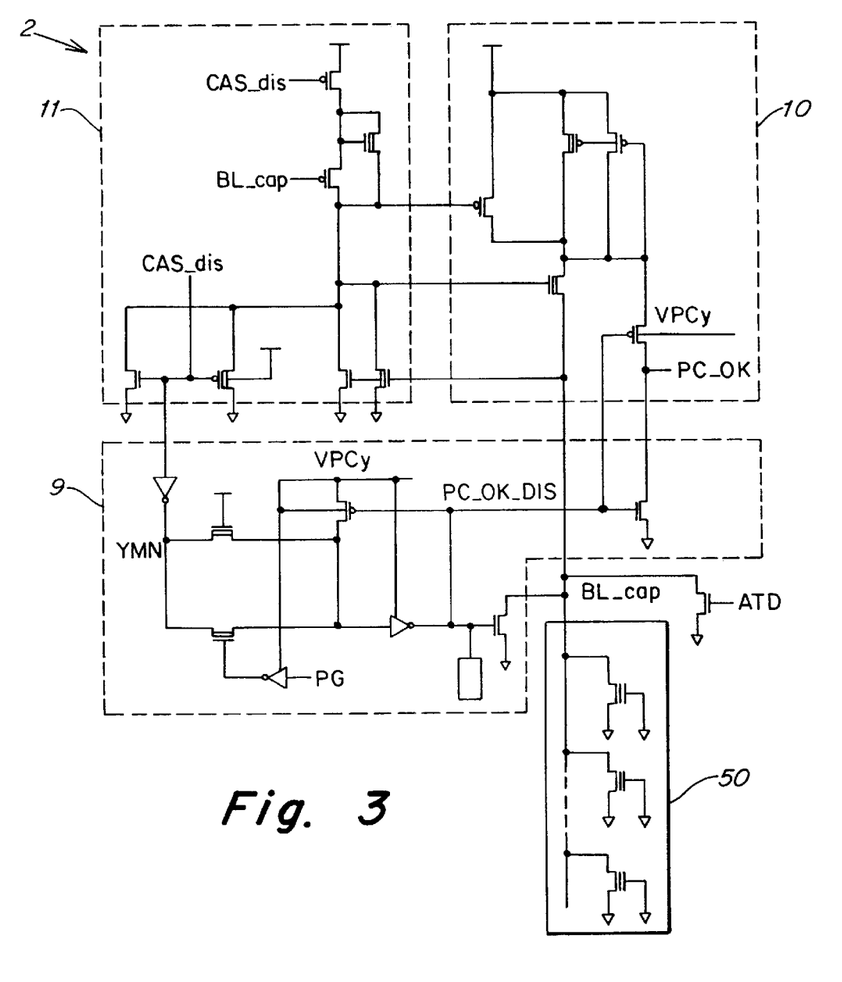
FIG. 3 is a detailed circuit diagram of a portion of the circuit shown in the block diagram of FIG. 1.

FIG. 3 is a detail view of the means 2 for reproducing the selection/deselection and pre-charge conditions of a generic bit line of a memory device (which, as mentioned earlier, is the subject of European patent application no. 95830360.4.

The circuit shown in FIG. 3 includes means 9 for simulating the selection of a bit line, which is adapted to simulate the characteristics of the selection/deselection structures, and the loads connected thereto, of a generic bit line of a memory device; means 10 for simulating the pre-charge of a generic bit line; a biasing structure 11; and a dummy bit line 50 that fully reproduces a generic bit line of a memory device.

Figure 6:
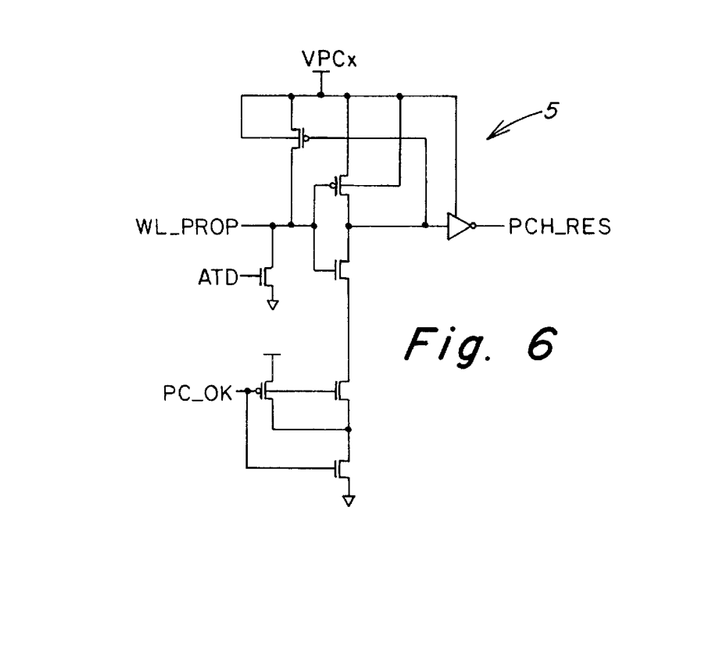
FIG. 6 is a detailed circuit diagram of a portion of the circuit shown in the block diagram of FIG. 1.

FIG. 6 is a detail view of the means 5 for determining the reaching of the working point of the bit and word lines, so as to produce the pre-charge interruption signal PCH_RES, thus determining a minimum pre-charge interval that is linked to the real delays of the propagations.

The circuit shown in FIG. 6 (which is the subject of a patent application, as already mentioned) receives in input the signal PC_OK emitted by the means 2 for reproducing the selection/deselection and pre-charge conditions of a generic word line, together with the signal WL_PROP that is emitted by the means 1 for reproducing propagation along a generic word line, and emits in output the pre-charge interruption signal PCH_RES.

As shown, the signal PCH_RES is therefore generated not only as a function of the signal ATD but also as a function of the signals WL_PROP and PC_OK.

Furthermore, the power supply of the circuit is VPCx, i.e., the supply voltage varies between $V_{DD}$ and the boost voltage. In this manner, the generation of the signal PCH_RES is also linked to the real power supply conditions that are present in the memory device.

Figure 4:
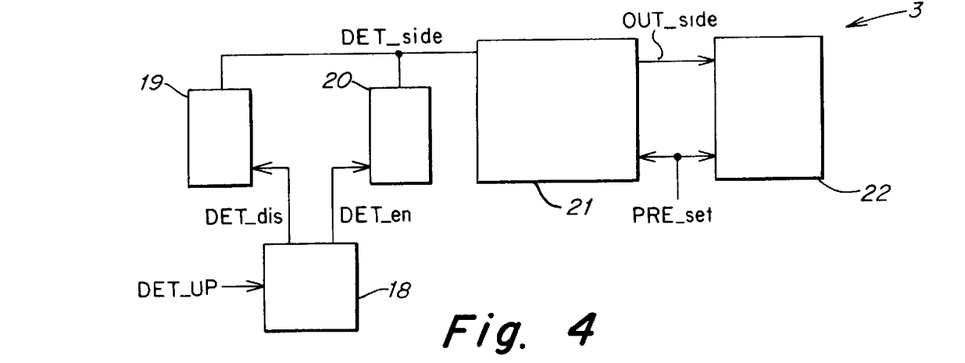
FIG. 4 is a detailed block diagram of a portion of the circuit shown in the block diagram of FIG. 1.
Figure 5:
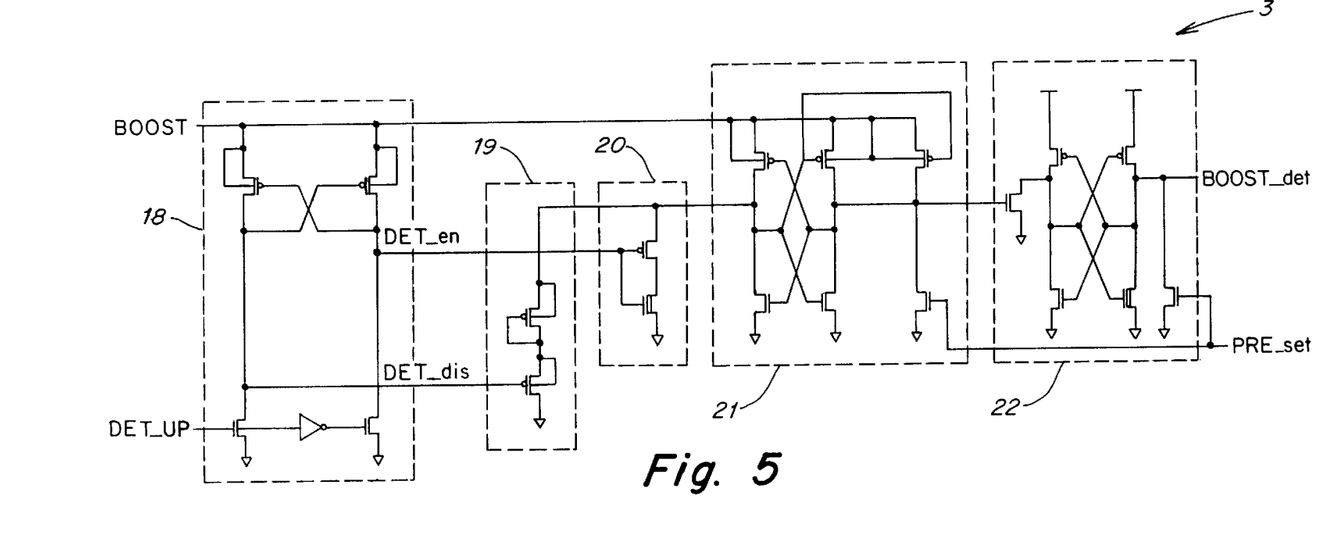
FIG. 5 is a detailed circuit diagram of the circuit shown in FIG. 4.

FIG. 4 is a detailed block diagram of the means 3 for detecting when a boost voltage reaches a threshold voltage. FIG. 5 is a detailed diagram of the circuit configuration (the circuit for generating the signal POR is described in a patent application mentioned above).

Therefore, with reference to FIGS. 4 and 5, the circuit is illustrated and described in summary form.

The reference numeral 18 designates a voltage elevator and level adapter stage, which receives on an input a control signal DET_up and the boost voltage BOOST to be monitored. The outputs of the stage 18 send signals DET_en and DET_dis respectively to a reference generating stage 20 (on the output whereof there is provided a reference voltage) and to a limiter stage 19, which also receives on an input the reference voltage.

The reference voltage is also sent in input to a threshold reaching sensing stage 21, of the lock-in type, which has a second input that receives the boost voltage BOOST to be monitored and an output that provides a logic signal that is sent on an input to a lock-in stage 22, which has an output BOOST_det that can be used by other circuits within the memory device.

Finally, each one of the stages 21 and 22 has a respective reset input whereon it receives the signal PREset.

In detail, the adapter stage 18 has the purpose of adapting the levels of the logic signals in input to the levels used in the threshold detector device and provides on its output the signals DET_en and DET_dis, which can be switched between zero and the boost voltage BOOST (high state). Accordingly, when DET_en and DET_dis are in the high state, they are locked in and follow the dynamics of the boost voltage BOOST.

The reference generating stage 20 has the purpose of generating in output the reference voltage, the value whereof is not constant but varies as the boost voltage BOOST varies.

In particular, in the presence of the enabling provided by the signal DET_en, the reference voltage is initially locked in to the boost voltage and follows its development exactly. As soon as the boost voltage to be monitored reaches a first threshold, the reference voltage continues to rise, but more slowly than the boost voltage, producing a nonzero voltage difference between the terminals of the sensing stage 21.

Finally, after the voltage BOOST to be monitored has reached its desired steady-state value, the reference voltage becomes zero.

The limiter stage 19 intervenes only if the boost voltage to be monitored exceeds the maximum expected threshold value.

This action has two purposes. First, this action causes switching of the sensing stage 21 in the described case (i.e., when the boost voltage exceeds the desired steady-state value) when mismatching problems arise between the reference generator 20 and the sensing stage 21 or when, for different reasons, the generator stage 20 behaves abnormally. Second, this action protects the generator stage 19 itself from excessively high voltages that might damage it.

The sensing stage 21 has the purpose of monitoring the voltage difference on its inputs and of generating on an output the signal BOOST_det, the logical value whereof indicates whether the voltage BOOST to be monitored has exceeded the preset threshold or not.

Figure 9:
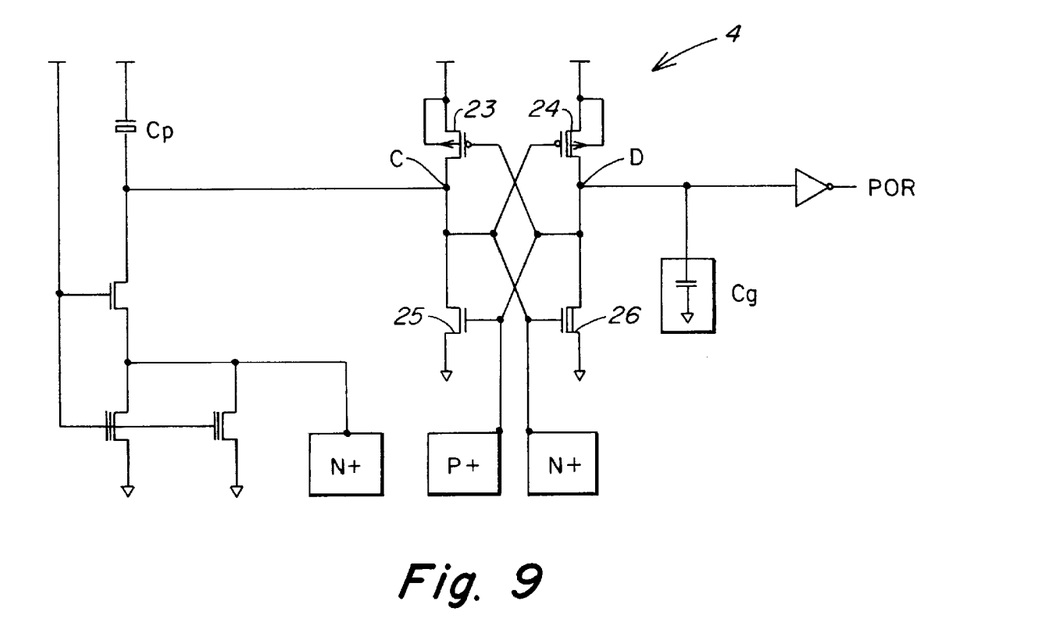
FIG. 9 is a detailed circuit diagram of a portion of the circuit shown in the block diagram of FIG. 1.

The means 4 for generating the signal POR are shown in detail in FIG. 9 (these means, too, are the subject of a previous patent application).

Power-on-reset circuits are widely used in logic devices to ensure correct positioning or initialization of the circuits at power-on. In particular, in non-volatile memories, power-on-reset circuits are used to initialize the registers containing the redundancy addresses. Furthermore, in latest-generation memory devices, the reading of the data stored in a non-volatile manner is internally time-controlled and requires correct start-up at device power-on time; this is indeed ensured by the use of power-on-reset circuits.

The power-on-reset circuit 4 behaves directly as a function of the behavior of a generic memory cell that is fully identical to the matrix memory cells.

The circuit shown in FIG. 9 includes a bistable circuit that is formed by two inverting stages that are cross-coupled in a so-called back-to-back configuration and is formed by the transistors 23, 24, 25, and 26.

The unbalancing of the circuit is intrinsically ensured at power-on by providing the two inverting stages with devices having different power-on threshold characteristics. Accordingly, at power-on, the bistable circuit sets itself in an unbalanced state (with the nodes C and D high and low, respectively) (generating a POR pulse) that is clearly defined and is maintained until the level of the voltage on the power supply node reaches a level that determines assured conductivity of the non-volatile elements.

Furthermore, the non-volatile elements must have a conductivity that is equal to, or greater than, the detectable value. This value is determined by the dimensions given to the load (transistor 23) and assuredly allows correct reading of the data item contained in a non-volatile cell.

This is achieved by a circuit which contains a non-volatile memory element that exactly reproduces the behavior of a generic matrix cell and by the dimensions given to the load 23.

The tripping of the bistable circuit, which includes reversing of the flip-flop, is determined by the non-volatile memory element of the circuit, which is functionally coupled to the intrinsically high node of the bistable circuit at power-on time. The capacitors $c_p$ and $c_g$ facilitate initial presetting so as to produce the POR pulse. The node C, as a function of the intrinsic electrical characteristics linked to the production process, passes from a condition of substantially no conductivity to a conducting condition when its threshold is exceeded.

The gradually increasing conductivity of the non-volatile memory element as the voltage rises on its drain node, which starting from the power-on of the device is coupled to the power supply node, causes the switching of the bistable circuit, causing the end of the POR pulse produced by the circuit.

Figure 7:
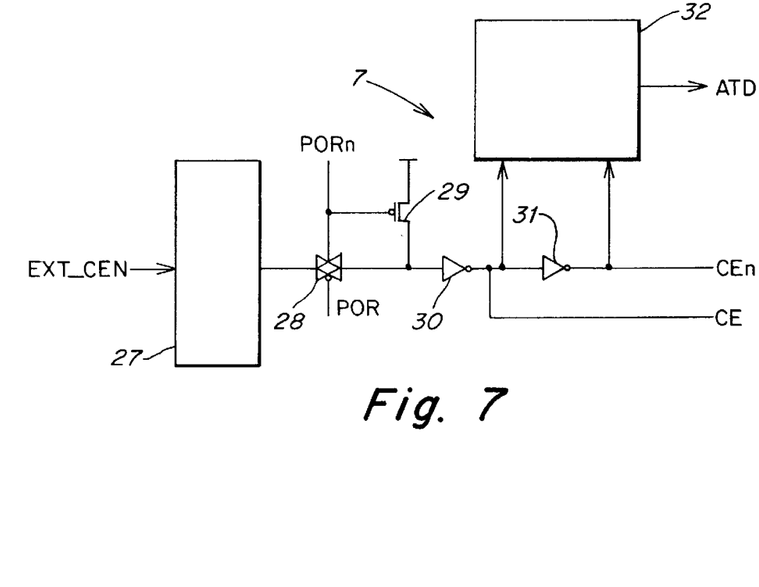
FIG. 7 is a detailed circuit diagram of a portion of the circuit shown in the block diagram of FIG. 1.

The means 7 for controlling and stimulating the reading of the memory device is shown in detail in FIG. 7.

The means 7 receives on an input a signal EXT_CEN, which is sent to a circuit 27 for generating a memory device enabling control signal, which produces the signal CEn_EXT.

The output of the circuit 27 is sent on an input to a pair of pass transistors 28 that is formed by a P-type transistor and by an N-type transistor. The signal POR, generated by the means 4 for generating the signal POR, is sent to the gate terminal of the P-type transistor, whereas the signal PORn (inverted POR) is sent to the gate terminal of the N-type transistor.

The signal PORn is also sent in input to the gate terminal of a P-channel transistor 29, which is interposed between the supply voltage (with its source terminal) and the pair of pass transistors 28 (with its drain terminal).

A first inverter 30 is connected to the drain terminal of the transistor 29, and its output is the memory device enable signal CE and, after passing through a second inverter 31, the signal CEn.

The signals CE and CEn are sent on inputs to a circuit 32 for generating the read address transition detection signal ATD.

Figure 10:
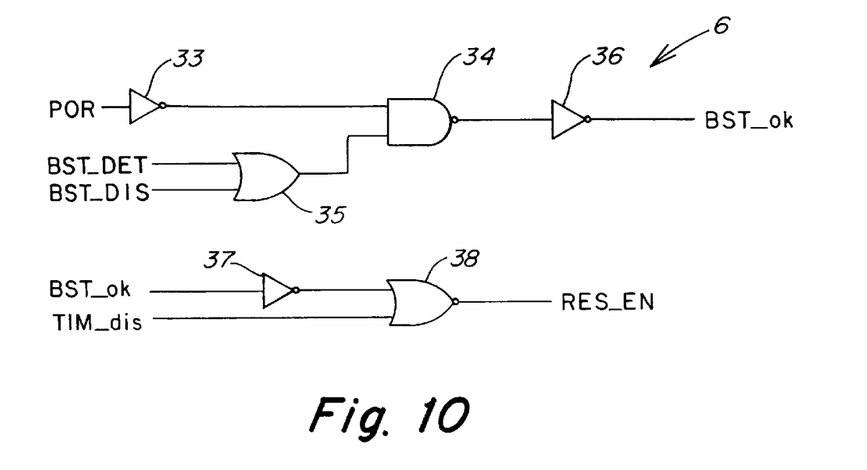
FIG. 10 is a detailed circuit diagram of a portion of the circuit shown in the block diagram of FIG. 1.

FIG. 10 is a detail view of the control logic means 6 adapted to generate on outputs the signal BST_ok and the signal RES_EN.

The signal POR is sent on an input to a first inverter 33, the output whereof is sent to a NAND gate 34 having two inputs. The second input of the NAND gate 34 is connected to the output of an OR gate 35 that receives on inputs the signals BST_DET and BST_DIS.

The output of the NAND gate 34, after passing through a second inverter 36, is the signal BST_ok.

In turn, the signal BST_ok, which is inverted by means of an inverter 37, is sent in input to a NOR gate 38, the second input whereof is a timing disable signal TIM_dis. The output of the NOR gate 38 is the signal RES_EN.

Figure 8:
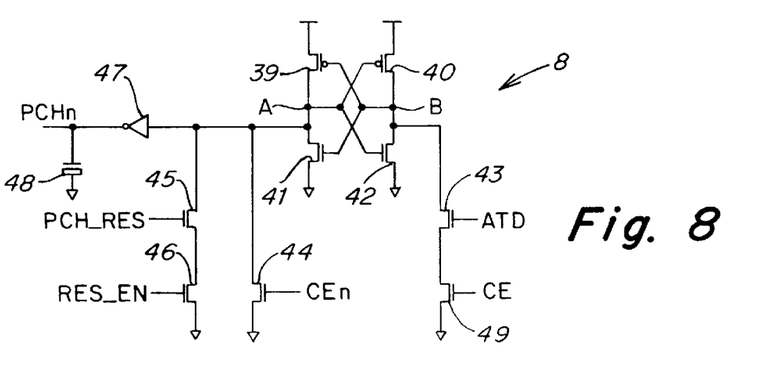
FIG. 8 is a detailed circuit diagram of a portion of the circuit shown in the block diagram of FIG. 1.

Finally, FIG. 8 illustrates the memory means 8 for the pre-charge step, which includes a circuit of the flip-flop type formed by two P-type transistors 39–40 and by two N-type transistors 41–42 that are common-drain connected between the supply voltage and the ground; the gate terminals of the transistors 39–41 and 40–42 are respectively connected to each other.

The node B of the flip-flop is connected to transistors 43 and 49 of the N type. These transistors 43 and 49 are controlled by the signals ATD and CE respectively.

The output node A of the flip-flop is connected to an N-channel type transistor 44, which receives the signal CEn at its gate terminal, and to a pair of N-channel transistors 45 and 46 that receive at their respective gate terminals, the signal PCH_RES, emitted by the means 5 for generating the pre-charge interval interruption signal, and the signal RES_EN, emitted by the control logic means 6. The output of the circuit of FIG. 8, inverted in an inverter 47, is the inverted pre-charge signal PCHn.

A capacitor 48 is connected between the output of the inverter 47 and the ground.

Figure 11:
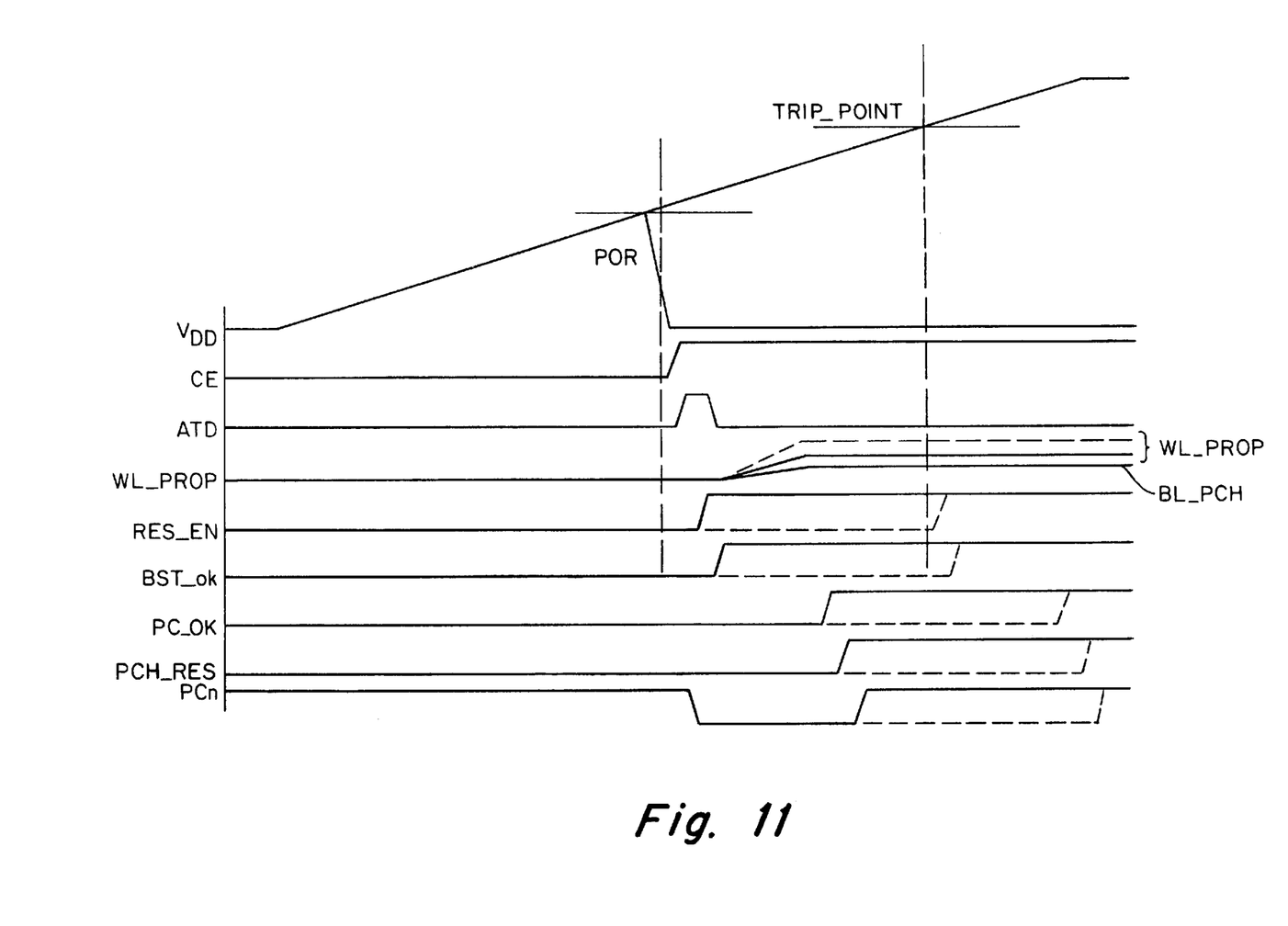
FIG. 11 is a chart of timings of various signals that are present in the circuit according to the invention when a boost voltage is not used.
Figure 12:
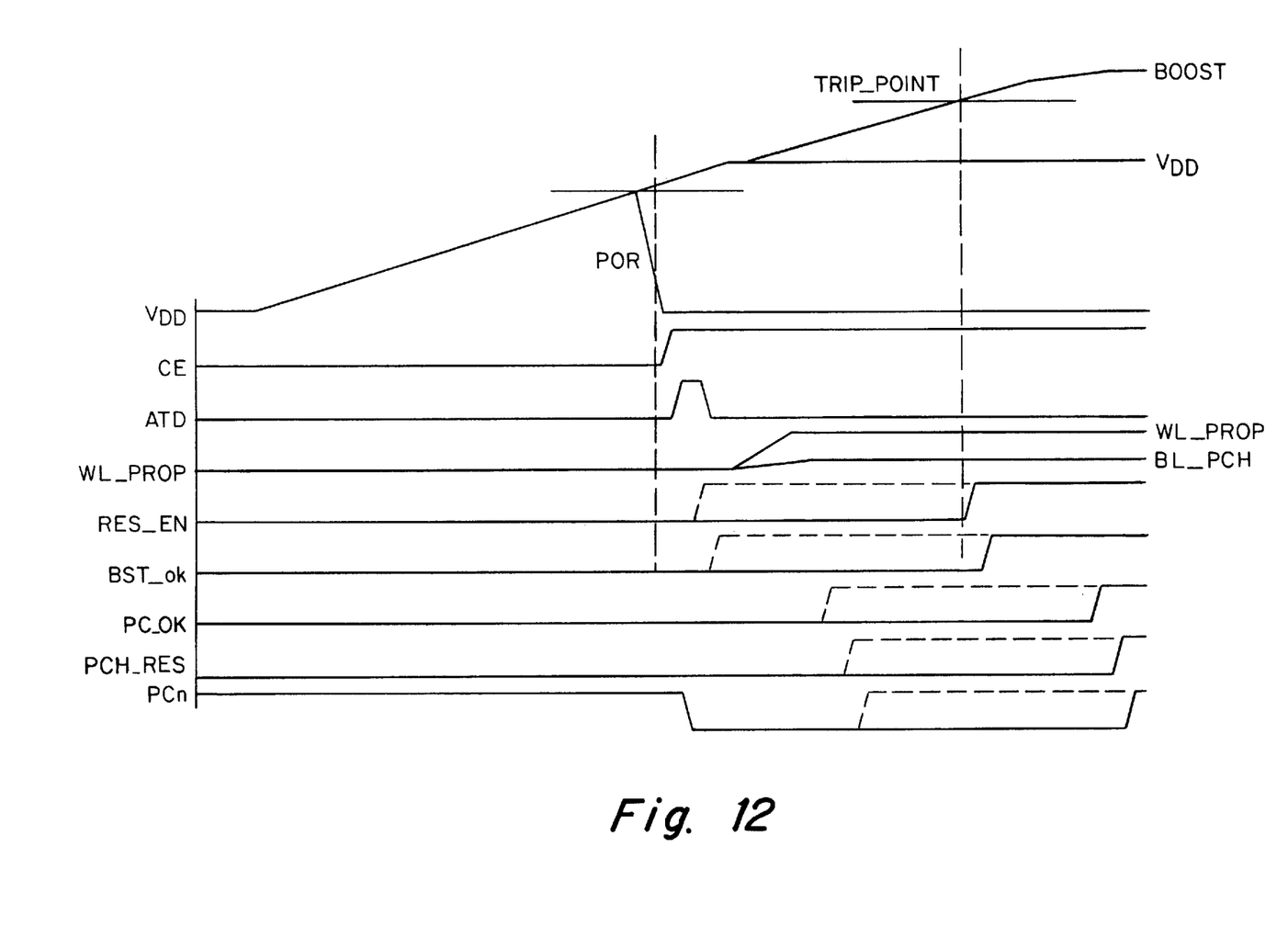
FIG. 12 is a timing chart, similar to the chart shown in FIG. 11, but in the case in which the boost voltage is used.

FIGS. 11 and 12 will be described with reference to the operation of the circuit according to the invention.

With reference to the above figures, operation of the circuit according to the invention is as follows.

The means 4 for generating the signal POR produces the POR signal when the memory device switches on, and the POR signal remains until the supply voltage reaches a value that allows assured reading of the information contained in the non-volatile elements (cells) of the memory device.

During this transient period, the elements 28 and 29 ensure the disabling of all reading operations (CE=0).

At the end of the POR signal, the means 7 for stimulating and controlling reading produces the read address transition detection signal ATD if, and only if, EXT_CEN=0 (from the very start). Otherwise, this occurs only on the high-low switching front of the input EXT_CEN.

With reference to FIG. 7, when the signal POR is high, i.e., PORn is low, the transistor 29 is in fact on and the pair of pass transistors 28 is off; accordingly, the signal that enters the inverter 30 is high and is thus inverted to the low level. In this manner, the signal CE for enabling the memory device is low and the signal ATD is not generated.

On the contrary, at the end of the POR signal (low POR), the signal CE is high (CEn is therefore low), and the signal ATD is generated.

The signal ATD thus generated is sent to the means 1 for reproducing propagations along a generic word line, which emits a signal WL-PROP that can be taken at one of the points 15, 16, and 17 of FIG. 2.

The signal ATD is also sent in input to the means 2 for reproducing the selection/deselection and pre-charge delays of a generic bit line, which emits on an output a pre-charge enable signal PC_OK; the signal PC_OK is sent on an input, together with the signal WL_PROP and the signal ATD, to the means 5 for determining the reaching of the working point of the bit line, to generate the signal PCH_RES for interrupting the pre-charge step.

In this manner, the duration of the pre-charge step is linked to the minimum functionality conditions required for the lines, taking into account the delays of the selection/deselection and propagation circuits, as well as the actual power supply conditions that are present in the memory device ($V_{DD}$ or boost voltage), in order to determine the minimum duration of the pre-charge step.

In general, the presence/absence of the voltage determines a different pre-charge interval (a shorter one in the first case), because the propagation conditions are different.

The minimum duration in any case allows for assured reading of the data of the memory, indeed because the delays that are intrinsic to the memory have been considered and therefore a so-called "dynamic" reading, i.e., a reading that is correlated to the actual operating conditions of the devices, is performed.

The signal ATD is also sent on an input to the memory means 8 for the bit line pre-charge step.

If the boost voltage is present, the means 3 for detecting when the boost voltage reaches a preset threshold intervene so as to link the reading timing to the reaching of the correct level of the boost voltage as well.

The means 3 emits on outputs the signal BST_DIS for checking the absence/presence of the boost voltage and the signal BST_DET for detecting the steady-state level of the boost voltage. These signals are sent on inputs, together with the POR signal, to the control logic means 6, which enables the reading of the memory device.

The control logic means 6 illustrates in FIG. 10 thus receives on an input the POR signal. When the POR signal is high, the signal BST_ok on an output from the means 6 is always low, regardless of the conditions of the signals BST_DET and BST_DIS, indicating that it is not yet time to perform reading.

When the POR signal becomes low, if BST_DIS=1, then BOOST_ok is produced almost immediately, whereas if BST_DIS=0, then until BST_DET is also 0, RES_EN is also 0. Therefore, one waits until the signal BST_DET is high, enabling the generation of the signal RES_EN (high), by means of the NOR gate 37, when the control signal TIM_dis is low (i.e., reading is really intended).

Otherwise, if TIM_dis is high, all reading is disabled.

The signal RES_EN, when high, resets the memory means 8 for the pre-charge step, ending the pre-charge step.

Otherwise, if the signal BST_DIS and the signal BST_DET are both at zero, then the output of the OR gate 35 is low and the output of the NAND gate 34 (when POR is low) is high, the signal BST_ok is low, and the signal RES_EN is not generated.

The memory means 8 for the pre-charge step therefore receives on inputs the signals PCH_RES, RES_EN, CEn, ATD, and CE, to generate the signal PCHn that is adapted to determine the end of the pre-charge step in correlation with the minimum functionality conditions of the various circuits of the memory, represented by the control signals that the memory means 8 receives on inputs.

In order to start a first correct reading of the memory device, the signal CE must be high (CEn must be low) and the signal of ATD must accordingly also be high. However, when the POR signal is active, the signal CE is forced to a low value (CEn is forced to a high value); when the POR signal ends (POR is low), and assuming that EXT_CEn is active from the very start (EXT_CEn=0), then a pulse of ATD is produced which: presets the pre-charge step; blocks all word line propagation; prevents any dummy pre-charge selection; and presets any start-up condition.

At the end of the pulse of ATD, the following operations are started: propagation of the signal WL-PROP; selection of the dummy bit line; and the wait for BST_ok to become high by means of the signal BST-DET.

Only when BST_DET=1, PC_OK=1, and WL_PROP=1 the pulse PCH_RES is produced, which ends the pre-charge step.

When the signal PCH_RES is high and the signal RES_EN is also high, the flip-flop of the memory means 8 is reset and the output signal PCHn is high to therefore interrupt the pre-charge step and capture the data for reading.

The signal RES_EN is generated by the control logic means 6 in relation to the signal BST_ok, when this last signal is high.

Of course, if the boost voltage is not present, the signal RES_EN is also not present and therefore the flip-flop of the memory means 8 is reset to produce the high signal PCHn only when the signal PCH_RES is high.

In this case, the only control for interrupting the pre-charge step is caused by the signal PCH_RES, which is generated simultaneously with the presence of the high signals WL_PROP and PC_OK, i.e., when propagation on the word line and selection/deselection of the bit line involved in the reading operation have occurred.

In summary, therefore, when all the conditions dictated by the above-mentioned control signals have occurred, i.e., when the various devices have reached their minimum functionality level (first of all, the memory cell has reached its minimum conductivity value), then the memory means 8 for the pre-charge step determines that the pre-charge step can be interrupted to perform reading.

It is evident that the determination of the pre-charge step interruption time and its actual execution are not performed with a preset delay, which might entail risks for reading, since it is not closely correlated to the conditions of the devices, but by defining a structure for controlling the activities and conditions of the various circuits of the memory, so as to link the read timing to the reaching of minimum operating conditions of the various devices, the minimum conditions in any case allowing to safely and assuredly read the data that are present in the memory.

FIGS. 11 and 12 are useful in showing the developments of the above-described signals. In particular, the figures show that as the supply voltage $V_{DD}$ rises, if no boost voltage is present (FIG. 11), the developments of the signals are determined by the solid lines, whereas if the boost voltage is present (FIG. 12), the developments of the signals are shifted (i.e., the dashed lines now plot the development when the boost voltage is not present), since the read timing waits for the trip point, designated by TRIP_POINT, to indicate the reaching of a preset minimum threshold on the part of the boost voltage.

These two charts therefore show the flexibility of the reading timing as a function of the level of the supply voltage.

The circuit according to the invention is therefore extremely flexible, since it can be used with the same structure even if the technology used in the production of the memory devices changes, as well as if the supply voltage and the temperature at which the memory device operates change.

The possibility, provided by the circuit according to the invention, of not having to set an arbitrary delay to be observed before performing reading ensures a read timing that is assuredly faster, in most cases, than the timing that can be provided otherwise, and at the same time allows a correctness of the read data that cannot be obtained with sampled-type readings having a predefined delay.

The set delay may in fact even be valid in most operating conditions, but it is evident that this does not in any way ensure correct reading, unless one initially defines a delay that is so long as to not be subjected to errors. It is evident that this clashes with the need to provide reading in the fastest possible manner as well as correctly.

The circuit according to the invention therefore provides, in practice, a sort of "dynamic delay" that flexibly adapts to the operating conditions of the memory device and to its structure.

In practice, it has been observed that the circuit according to the invention fully achieves the intended aim, since it allows to link the reading timing to the reaching of the minimum functionality conditions of a generic memory cell of the memory device, so as to allow a first reading of the memory device, after activation of the power supply, only in assured data reading conditions, eliminating the drawbacks due to the transient step of the supply voltage.

Indeed, even if the supply voltage has not yet reached its steady-state level, the data of the memory device are always read in assured reading conditions.

The circuit according to the invention allows to link the first reading operation to the power supply conditions that are actually present in the memory device (voltage $V_{DD}$ or boost voltage) and to the selection/deselection, propagation, and pre-charge delays of a generic bit line and of the word line of the memory device.

The circuit according to the invention therefore overcomes the problems linked to the power-on of a device the operation whereof is controlled by a memory, since the first reading of the data is always performed correctly because it is correlated with the actual operating conditions of the memory device.

Numerous modifications and variations can be made to the circuit and are intended to be within the scope of the invention.

For example, the means 5 for determining the reaching of the working point on the part of the bit line to generate the signal PCH_RES for interrupting the pre-charge step may not provide for lock-in with the propagation of the signal along the generic bit line but only along the generic word line. Therefore, in this case the signal PC_OK is not generated and the portion of circuit to which the signal is sent in input is not provided.

The previously described embodiment of the invention provides for the correlation between the beginning of a reading cycle for a non-volatile memory and the reaching of the minimum functionality characteristics of the functionally most critical memory element, i.e., the non-volatile cell.

As technology evolves, the functionally most critical element might no longer be the non-volatile cell; in this case, the correlation of the timing must be performed with the new most critical element and the above remarks still hold.

Finally, some elements may be replaced with other technically equivalent elements.

In practice, the materials employed, so long as they are compatible with the specific use, as well as the dimensions, may be any according to the requirements and the state of the art.

Where technical features mentioned in any claim are followed by reference signs, those reference signs have been included for the sole purpose of increasing the intelligibility of the claims and accordingly such reference signs do not have any limiting effect on the interpretation of each element identified by way of example by such reference signs.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit for read-enabling a memory device with checking of minimum functionality conditions of a memory cells and reading circuits, the circuit comprising:

a structure for reproducing operating conditions within a memory matrix to determine a minimum duration of a pre-charge step for pre-charging bit lines involved in a reading operation, said structure being adapted to generate a pre-charge step interruption signal that depends on a reaching of the minimum functionality conditions;

control logic means;

reading control and stimulation means;

means for generating a power-on-reset signal for enabling reading when the minimum functionality conditions for reading correctness are reached, said power-on-reset signal generating means being adapted to drive the control logic means and the reading control and stimulation means; and memory means for the pre-charge step, said memory means being driven by said structure for reproducing the operating conditions within the memory matrix, by said control logic means, and by said reading control and stimulation means, wherein said memory means for the pre-charge step causes, at an onset of the minimum functionality conditions, an end of the pre-charge step to perform a first reading of the memory cells in assured conditions.

2. The circuit of claim 1, further comprising:

means for determining a reaching of a preset threshold level on a part of a boost voltage that is present in the memory device, said means for determining the reaching of the threshold level being connected to said control logic means to have said control logic means generate a read enable signal as a consequence of the reaching of the minimum functionality conditions of the memory cell involved in the reading operation.

3. The circuit of claim 1, wherein said structure for reproducing the operating conditions within the memory matrix includes:

means for reproducing propagations along a generic word line;

means for reproducing selection/deselection and pre-charge delays of a generic bit line; and means for determining a reaching of a working point of a bit line involved in the reading operation; said means for reproducing the propagations along a generic word line and said means for reproducing the selection/deselection and pre-charge delays of the generic bit line driving said means for determining the reaching of the working point, in order to generate the pre-charge step interruption signal, wherein the pre-charge step interruption signal is sent to said memory means for the pre-charge step.

4. The circuit of claim 1, wherein said reading control and stimulation means generates a read address transition detection signal, said read address transition detection signal being sent to said structure for reproducing the operating conditions inside the memory matrix, to said control logic means, and to said memory means for the pre-charge step, said read address transition detection signal being generated when said power-on-reset signal is reset to zero.

5. The circuit of claim 4, wherein said means for generating the power-on-reset signal includes at least one non-volatile element that is identical, in terms of characteristics and dimensions, to a generic matrix cell, in order to allow recognition of a minimum activation threshold of said non-volatile element and of its conductivity in relation to a tripping condition of said means for generating the power-on-reset signal, said power-on-reset signal being reset to zero when said minimum functionality conditions of the memory device are reached, in order to generate said read address transition detection signal.

6. The circuit of claim 3, wherein said means for reproducing propagations along a generic word line and said means for determining the reaching of the working point on the part of the bit line that is involved in the reading operation are supplied at the actual supply voltage of said memory device, said actual supply voltage varying from a low-level voltage to a boost voltage.

7. A method for performing a first reading in assured conditions for a memory device, comprising the steps of:

generating a power-on-reset signal that is linked to a threshold and to a minimum detectable conductivity of a memory cell that is identical to a generic memory cell of said memory device, said power-on-reset signal indicating an onset of minimum functionality conditions of said generic memory cell and deactivating all reading activity throughout its duration;

generating, at the end of said power-on-reset signal, a read address transition signal to stimulate a reading operation of said memory device;

reproducing propagation delays of selection/deselection and pre-charge signals for a generic word line and for a generic bit line of the memory device, and generating a signal for determining a reaching of a working point of a bit line involved in the reading operation;

initializing memory matrix line pre-charge activities; and generating, at the onset of the minimum functionality conditions, a pre-charge step end signal, for subsequent first reading, in assured conditions, of said memory device.

8. The method of claim 7, further comprising a step of:

generating a signal for indicating an exceeding of a preset minimum threshold on a part of a boost voltage, said signal determining an onset of minimum power supply conditions provided for the memory device.

9. The method of claim 8, wherein said signal for indicating the exceeding of the preset minimum threshold on the part of a boost voltage enables generation of a signal for enabling reading timing of said memory device.

10. The method of claim 7, wherein said step of generating the signal that determines the reaching of the working point on the part of said bit line is provided in correlation with actual power supply conditions of the memory device, said actual power supply conditions varying from a low supply voltage to a boost voltage.

11. A memory circuit for a pre-charge step of a bit line involved in a reading operation, for circuits for synchronizing a first reading of a memory device with minimum functionality conditions of memory cells and reading circuits, comprising:

a memory structure having a first node and a second node, a first control branch connected to said first node, a second control branch connected to said second node, and a third control branch connected to said second node, and parallel-connected to the second control branch, said memory structure being set according to minimum functionality conditions expressed by said first, second, and third control branches, in order to determine an interruption of the pre-charge step of the bit line involved in the reading operation, in order to read said bit line.

12. The memory circuit of claim 11, wherein said memory structure is a flip-flop.

13. The memory circuit of claim 11, wherein said first control branch includes:

a first transistor having a gate terminal to receive a read address transition detection signal for said memory device; and a second transistor having a gate terminal to receive an enable signal for said memory device.

14. The memory circuit of claim 11, wherein said second control branch includes:

a third transistor having a gate terminal to receive an inverted enable signal for said memory device.

15. The memory circuit of claim 11, wherein said third control branch includes:

a fourth transistor having a gate terminal to receive a signal indicating the interruption of the pre-charge step, and a fifth transistor having a gate terminal to receive an enable signal for resetting the pre-charge step to an initial condition.

16. The memory circuit of claim 11, further comprising:

an inverter connected to said second and third control branches, in order to emit as an output a signal that is adapted to interrupt the pre-charge step of the bit line involved in the reading operation, in order to read it.

17. A device for read-enabling a memory device with checking of minimum functionality conditions of a memory cells and reading circuits, the device comprising:

a structure for reproducing operating conditions within a memory matrix to determine a minimum duration of a pre-charge step for pre-charging bit lines involved in a reading operation, said structure being adapted to generate a pre-charge step interruption signal that depends on a reaching of the minimum functionality conditions;

a control logic circuit;

a reading control and stimulation circuit;

a power-on-reset circuit for generating a power-on-reset signal for enabling reading when the minimum functionality conditions for reading correctness are reached, said power-on-reset circuit being adapted to drive the control logic circuit and the reading control and stimulation circuit; and a memory circuit for the pre-charge step, said memory circuit being driven by said structure for reproducing the operating conditions within the memory matrix, by said control logic circuit, and by said reading control and stimulation circuit, wherein said memory circuit for the pre-charge step causes, at an onset of the minimum functionality conditions, an end of the pre-charge step to perform a first reading of the memory cells in assured conditions.

18. The device of claim 17, wherein the memory circuit includes:

a memory structure having a first node and a second node, a first control branch connected to said first node, a second control branch connected to said second node, and a third control branch connected to said second node, and parallel-connected to the second control branch, said memory structure being set according to minimum functionality conditions expressed by said first, second, and third control branches, in order to determine an interruption of the pre-charge step of the bit line involved in the reading operation, in order to read said bit line.

* * * * *